US012740291B2

(12) United States Patent
Wang

(10) Patent No.: US 12,740,291 B2
(45) Date of Patent: Sep. 15, 2026

(54) DISPLAY PANEL AND MANUFACTURING METHOD THEREOF, AND DISPLAY DEVICE HAVING AN INORGANIC LAYER WITH A STRESS RELIEF STRUCTURE

(71) Applicant: BEIJING XIAOMI MOBILE SOFTWARE CO., LTD., Beijing (CN)

(72) Inventor: Zheng Wang, Beijing (CN)

(73) Assignee: BEIJING XIAOMI MOBILE SOFTWARE CO., LTD., Beijing (CN)

( * ) Notice: Subject to any disclaimer, the term of this patent is extended or adjusted under 35 U.S.C. 154(b) by 416 days.

(21) Appl. No.: 18/243,051

(22) Filed: Sep. 6, 2023

(65) Prior Publication Data

US 2024/0389431 A1 Nov. 21, 2024

(30) Foreign Application Priority Data

May 15, 2023 (CN) ........................ 202310545086.5

(51) Int. Cl.

| | |
|---|---|
| ***H10K 59/80*** | (2023.01) |
| ***H10K 59/12*** | (2023.01) |
| ***H10K 59/122*** | (2023.01) |
| ***H10K 71/16*** | (2023.01) |

(52) U.S. Cl.

CPC ....... *H10K 59/873* (2023.02); *H10K 59/1201* (2023.02); *H10K 59/122* (2023.02); *H10K 71/162* (2023.02)

(58) Field of Classification Search

CPC ............. H10K 59/873; H10K 59/1201; H10K 59/122; H10K 71/162

See application file for complete search history.

(56) References Cited

U.S. PATENT DOCUMENTS

| | | | | |
|---|---|---|---|---|
| 2011/0139760 | A1* | 6/2011 | Shah | H01S 3/0057 219/121.6 |
| 2018/0047940 | A1 | 2/2018 | Sonoda et al. | |
| 2019/0326375 | A1* | 10/2019 | Ochi | G09F 9/30 |
| 2019/0363267 | A1* | 11/2019 | Tanaka | H05B 33/02 |
| 2020/0203443 | A1 | 6/2020 | Zhao et al. | |
| 2021/0367206 | A1 | 11/2021 | Li | |
| 2024/0389397 | A1* | 11/2024 | Ham | H10K 59/122 |

FOREIGN PATENT DOCUMENTS

| | | | |
|---|---|---|---|
| CN | 107425134 | A | 12/2017 |
| CN | 111384281 | A | 7/2020 |
| WO | 2021103979 | A1 | 6/2021 |

OTHER PUBLICATIONS

Li et al.,CN111384281, machine translation Jul. 2020 (Year: 2020).*
Extended European Search Report issued in Application No. 23198326.3 dated Mar. 13, 2024,(9p).

* cited by examiner

*Primary Examiner* — Tracie Y Green
(74) *Attorney, Agent, or Firm* — Arch & Lake LLP; Hao Tan; Shen Wang

(57) ABSTRACT

A display panel and a manufacturing method thereof, and a display device are provided. The display panel includes: a substrate; a light-emitting layer, disposed on a side of the substrate; and a first inorganic layer that covers a surface of the light-emitting layer away from the substrate, where a surface of the first inorganic layer away from the light-emitting layer has a stress relief part.

17 Claims, 4 Drawing Sheets

DISPLAY PANEL AND MANUFACTURING METHOD THEREOF, AND DISPLAY DEVICE HAVING AN INORGANIC LAYER WITH A STRESS RELIEF STRUCTURE

CROSS-REFERENCE

The present application is based upon and claims priority to Chinese Patent Application No. 202310545086.5, filed on May 15, 2023, the entire contents of which are incorporated herein by reference for all purposes.

TECHNICAL FIELD

The present disclosure relates to the field of display technologies, and more particularly, to a display panel and a manufacturing method thereof, and a display device.

BACKGROUND

In recent years, due to advantages of self-luminescence, wide viewing angle, short response time, high luminous efficiency, wide color gamut, and low operating voltage, Organic Light-Emitting Diodes (OLEDs) have become very popular display products for people, and increasingly electronic devices are equipped with OLED display panels.

Touch-related functional components are integrated on screens of the electronic devices. In the touch-related functional components, metal wires are typically used for signal transmission between dies and other circuit components. Since metal wires have quite small diameters, they are prone to breakage. In the related arts, the metal wires are generally encapsulated by means of a dispensing process. There are only small gaps between dispensing encapsulation portions and panels of the OLED display panels.

SUMMARY

The present disclosure provides a display panel and a manufacturing method thereof, and a display device.

In a first aspect, embodiments of the present disclosure provide a display panel, and the display panel includes:

- a substrate;
- a light-emitting layer, disposed on a side of the substrate; and
- a first inorganic layer that covers a surface of the light-emitting layer away from the substrate, where a surface of the first inorganic layer away from the light-emitting layer has a stress relief part.

In a second aspect, embodiments of the present disclosure provide a method for manufacturing a display panel, and the method includes:

- forming a light-emitting layer on a substrate; and
- forming a first inorganic layer on a side of the light-emitting layer away from the substrate, where a surface of the first inorganic layer away from the light-emitting layer has a stress relief part.

In a third aspect, embodiments of the present disclosure provide a display device, and the display device includes the display panel described in the first aspect.

BRIEF DESCRIPTION OF THE DRAWINGS

In order to explain technical solutions in embodiments of the present disclosure more clearly, drawings needed in the description of these embodiments will be briefly introduced below. Obviously, the drawings in the following description are only some embodiments of the present disclosure. For those of ordinary skill in the art, other drawings can be obtained from these drawings without creative labor.

REFERENCE SIGNS

- 000, crack;
- 100, substrate;
- 200, light-emitting layer; 210, pixel definition layer; 220, light-emitting device;
- 300, first inorganic layer; 300*a*, surface; 310, stress relief part; 311, groove; 312, stress absorber;
- 400, organic layer;
- 500, driving layer; 510, buffer layer; 520, polysilicon layer; 530, gate insulation layer; 540, gate metal layer; 550, interlayer dielectric layer; 560, source-drain metal layer; 570, planarization layer; 580, anode layer;
- 600, functional film layer; 610, second inorganic layer; 620, touch layer; 630, pressure-sensitive adhesive layer; 640, polarizer layer; 650, optical adhesive layer; 660, glass cover plate.

DETAILED DESCRIPTION

In order to make technical solutions and advantages of the present disclosure clearer, implementations of the present disclosure will be further described in detail below with reference to the drawings.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of examples do not represent all implementations consistent with the disclosure. Instead, they are merely examples of apparatuses and methods consistent with aspects related to the disclosure as recited in the appended claims.

Reference throughout this specification to "one embodiment," "an embodiment," "an example," "some embodiments," "some examples," or similar language means that a particular feature, structure, or characteristic described is included in at least one embodiment or example. Features, structures, elements, or characteristics described in connection with one or some embodiments are also applicable to other embodiments, unless expressly specified otherwise.

Touch-related functional components are integrated on screens of the electronic devices. In the touch-related functional components, metal wires are typically used for signal transmission between dies and other circuit components. Since metal wires have quite small diameters, they are prone to breakage. In the related arts, the metal wires are generally encapsulated by means of a dispensing process. There are only small gaps between dispensing encapsulation portions and panels of the OLED display panels.

Figure 1:
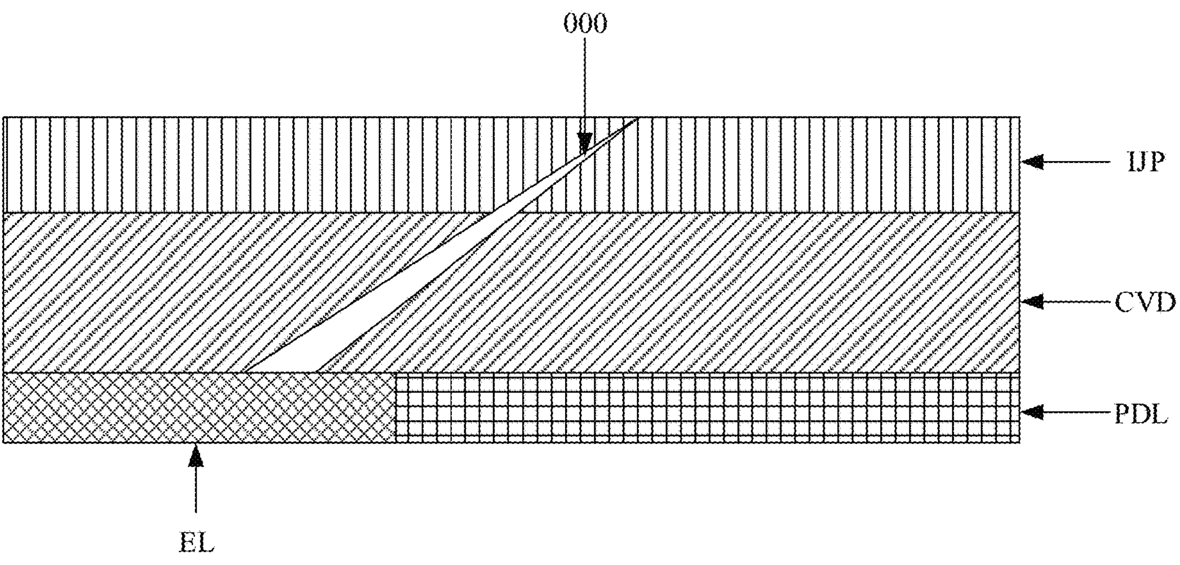
FIG. 1 is a schematic diagram of crack expansion generated by a display panel in a whole-device drop scene in the related arts.

In the related arts, in a case that an electronic device configured with an OLED display screen drops, the screen is prone to black spots. The inventors have found through tests that this situation is mostly caused by a fractures and a crack occurred in an organic layer of a panel which result from the collision or extrusion of a gold wire encapsulation structure of a die with the panel under the action of a strong external force upon dropping. The inventor further analyzed and found that, as shown in FIG. 1, a starting position of a crack 000 is at an interface of a light-emitting layer EL and a pixel definition layer PDL with an inorganic layer CVD, and the crack 000 expands to an interior of the inorganic layer CVD, thereby splitting an organic layer IJP.

Embodiments of the present disclosure provide a display panel, which may be an OLED display panel. The display panel can prevent a crack from extending to an organic layer, thereby improving the performance of an electronic device configured with an OLED display screen in a drop scene, and effectively improving the phenomenon of black spots on the screen.

Figure 2:
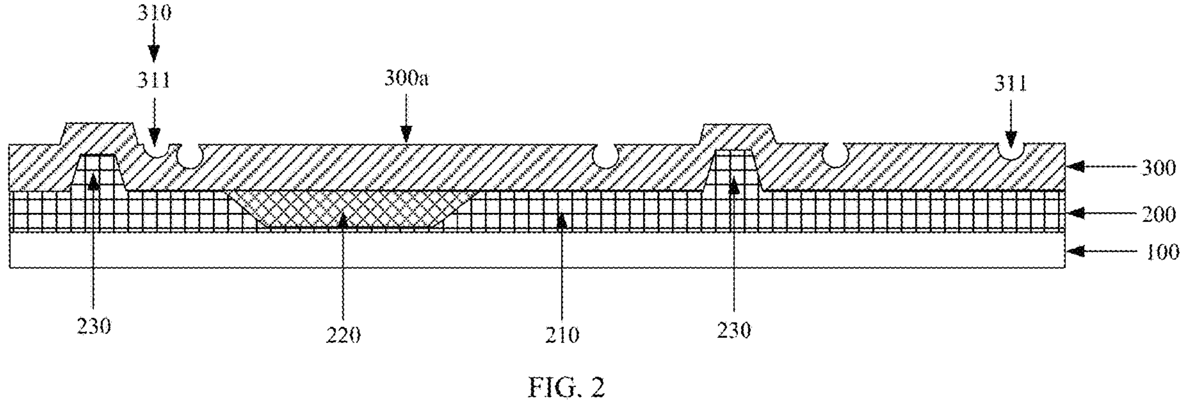
FIG. 2 is a schematic structural diagram of a display panel provided by an embodiment of the present disclosure.

As shown in FIG. 2, embodiments of the present disclosure provide a display panel, and the display panel includes:

a substrate 100;

a light-emitting layer 200, disposed on a side of the substrate 100; and a first inorganic layer 300, covering a surface of the light-emitting layer 200 away from the substrate 100;

a surface 300*a* of the first inorganic layer 300 away from the light-emitting layer 200 has a stress relief part 310.

In the display panel provided by embodiments of the present disclosure, the surface 300*a* of the first inorganic layer 300 away from the light-emitting layer 200 is provided with the stress relief part 310. When the crack 000 occurs at an interface between the first inorganic layer 300 and the light-emitting layer 200, it will pass through the stress relief part 300 during the expansion towards the interior of the first inorganic layer 300, and then the stress relief part 310 can relieve a stress of the first inorganic layer 300 here, thereby preventing the expansion of the crack 000 and preventing it from affecting the performance of other film layers including an organic layer 400. Therefore, the display panel provided by embodiments of the present disclosure improves the performance of the electronic device configured with the OLED display screen in the drop scene, and effectively improves the phenomenon of black spots on the screen.

In some implementations of embodiments of the present disclosure, as shown in FIG. 2, the stress relief part 310 is a groove 311, and an opening end of the groove 311 is on the surface 300*a* of the first inorganic layer 300 away from the light-emitting layer 200.

Figure 3:
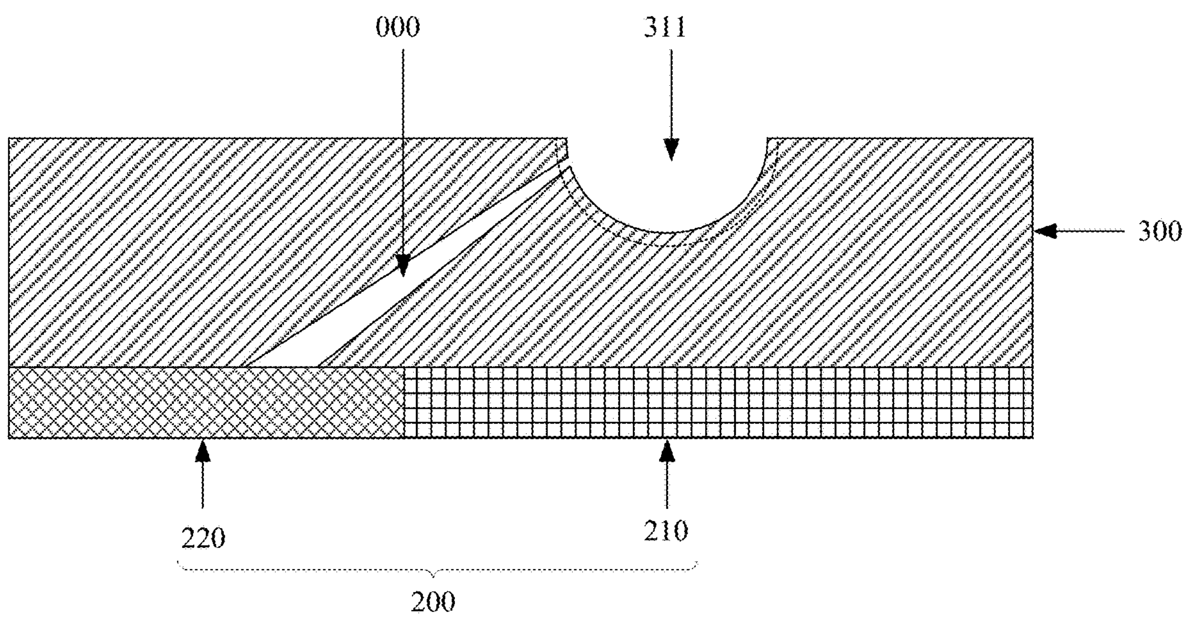
FIG. 3 is a schematic diagram of a working principle of a stress relief part provided by an embodiment of the present disclosure.

As shown in FIG. 3, the surface 300*a* of the first inorganic layer 300 away from the light-emitting layer 200 is opened with at least one groove 311, and a compressive stress layer (that is, an area between the dotted line and a groove wall of the groove 311 in FIG. 3) with a thickness of nanometers can be formed on an outside of the groove wall of each groove 311. When the crack 000 initiated at an edge of the light-emitting layer 200 that is caused by the collision due to the whole-device drop expands to an outer edge of the groove 311, the compressive stress layer will absorb the expansion energy of the crack 000, and at the same time, the groove 311 will relieve the stress concentration at the tip of the crack 000, so that the stress of the first inorganic layer 300 that forms the crack 000 is released at the groove 311, thereby avoiding the further expansion of the crack 000.

In some embodiments of the present disclosure, the groove 311 may be formed on the surface 300*a* of the first inorganic layer 300 away from the light-emitting layer 200 by means of etching, ablation and the like.

In some embodiments of the present disclosure, the groove 311 is a laser ablation groove, and a diameter of the laser ablation groove is in a range of 10-100 nm.

The laser ablation groove refers to the groove 311 formed by means of laser irradiation. When the laser is irradiated to the surface 300*a* of the first inorganic layer 300 away from the light-emitting layer 200, a laser pulse will bombard the surface 300*a* multiple times, causing a surface material forming the surface 300*a* of the first inorganic layer 300 to melt and gasify instantaneously, so as to form the groove 311 with a certain depth.

In embodiments of the present disclosure, when the diameter of the laser ablation groove formed on the surface 300*a* is in the range of 10-100 nm, the laser irradiation on the surface 300*a* is stopped. A whole-device drop test indicates that the laser ablation groove within this diameter range can withstand a certain pressure and has little impact on a display performance of the panel.

In some embodiments of the present disclosure, an orthographic projection of the groove 311 on the substrate 100 is outside an orthographic projection of a light-emitting device 220 of the light-emitting layer 200 on the substrate 100.

As shown in FIG. 2, the light-emitting layer 200 includes a pixel definition layer 210 and at least one light-emitting device 220 defined by the pixel definition layer 210. When there are a plurality of light-emitting devices 220, the plurality of light-emitting devices 220 are used to form a plurality of sub-pixels, and at least two sub-pixels among the plurality of sub-pixels have different colors from each other.

The plurality of light-emitting devices 220 are separated from each other by the pixel definition layer 210. Illustratively, the pixel definition layer 210 is opened with a plurality of pixel openings, each pixel opening is used to define an arrangement space of one light-emitting device 220, and the plurality of light-emitting devices 220 are in the plurality of pixel openings in a one-to-one correspondence.

When the first inorganic layer 300 is irradiated by using the laser, care should be taken to avoid a position corresponding to the light-emitting device 220, so as to prevent the formed groove 311 from affecting the light-emitting device 220 to cause the color cast between large viewing angles. As shown in FIG. 2, the orthographic projection of the groove 311 on the substrate 100 is outside the orthographic projection of the light-emitting device 220 on the substrate 100.

In some embodiments of the present disclosure, as shown in FIG. 2, the light-emitting layer 200 further includes a spacer 230 on a side of the pixel definition layer 210 away from the substrate 100. The same light-transmitting material is used for the spacer 230 and the pixel definition layer 210, and the spacer 230 and the pixel definition layer 210 are made by one patterning process. Illustratively, the spacer and 230 the pixel definition layer 210 are made of transparent polyimide or a silicone material.

Figure 4:
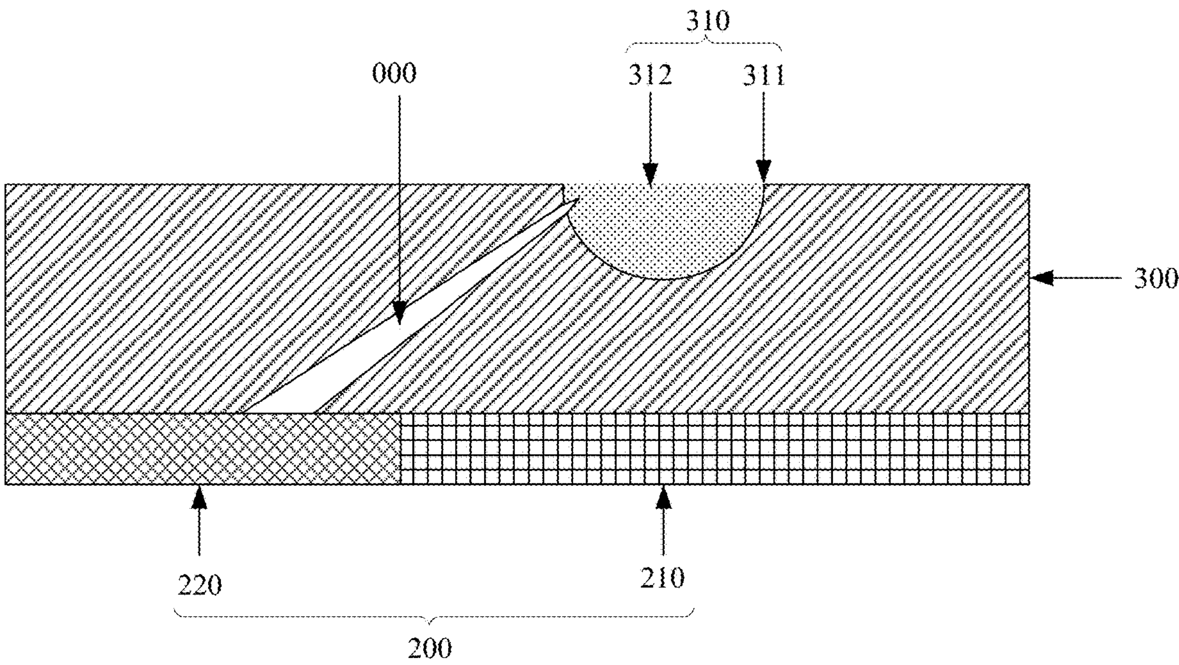
FIG. 4 is a schematic diagram of a working principle of another stress relief part provided by an embodiment of the present disclosure.

In another implementation of embodiments of the present disclosure, as shown in FIG. 4, the stress relief part 310 includes the groove 311 and a stress absorber 312. The groove 311 is opened on the first inorganic layer 300, and the opening end of the groove 311 is on the surface 300*a* of the first inorganic layer 300 away from the light-emitting layer 200. The stress absorber 312 is filled in the groove 311 and is configured to absorb energy released by a stress concentration site on the first inorganic layer 300.

The stress absorber 312 is filled in the groove 311 and is in connection with an inner wall of the groove 311. When the crack 000 generated by the edge of the light-emitting layer 200 which is caused by the collision due to the whole-device drop expands to the groove 311, it will further expand to the stress absorber 312. However, the stress absorber 312 will absorb the expansion energy of the crack 000, while relieving the stress concentration at the tip of the crack 000, so as to prevent the crack 000 from continuing to expand.

The stress absorber 312 can play a role of absorbing the energy through a special structure or material. For example, the stress absorber 312 may have a multi-cavity, porous structure. For another example, the stress absorber 312 may be an elastic member with sufficient elastic margin in the groove 311. When a stress is transferred to the stress absorber 312, the stress absorber 312 can deform, so as to consume the energy.

Figures 5, 6:
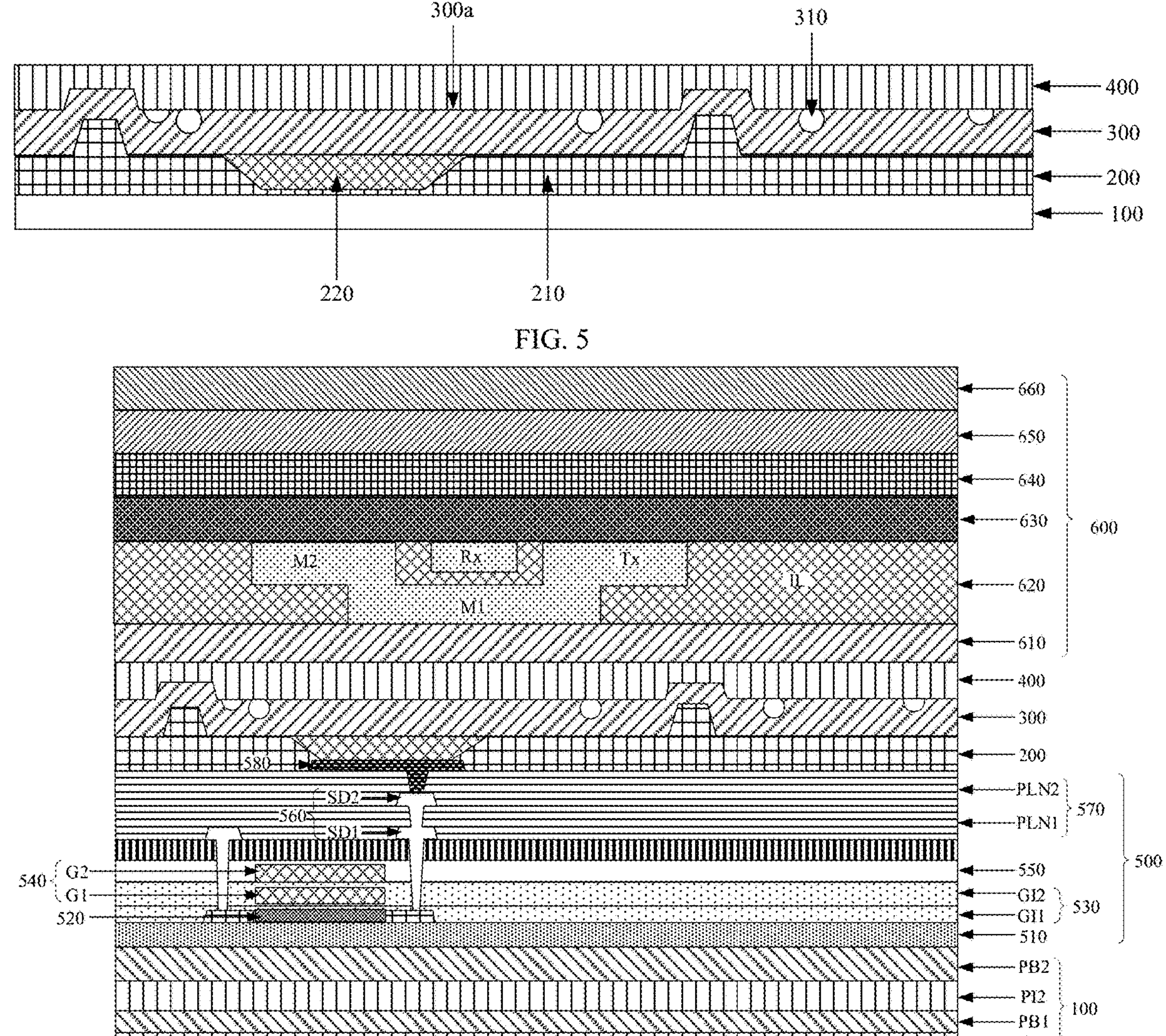
FIG. 5 is a schematic structural diagram of another display panel provided by an embodiment of the present disclosure.
FIG. 6 is a schematic structural diagram of yet another display panel provided by an embodiment of the present disclosure.

In some embodiments of the present disclosure, as shown in FIG. 5, the display panel further includes an organic layer 400, and the organic layer 400 covers the surface 300*a* of the first inorganic layer 300 away from the light-emitting layer 200, and is in contact with the stress relief part 310.

An encapsulation layer includes a plurality of inorganic layers and a plurality of organic layers 400, and the plurality of inorganic layers and the plurality of organic layers 400 are alternately stacked. FIG. 6 shows a simple three-layer encapsulation structure, including the first inorganic layer 300, the organic layer 400 and a second inorganic layer 610. The first inorganic layer 300 and the second inorganic layer 610 are formed by a chemical vapor deposition process, and the organic layer 400 is formed by an inkjet printing process.

In embodiments of the present disclosure, the stress relief part 310 is between the first inorganic layer 300 and the organic layer 400 of the encapsulation layer, and is in contact with the organic layer 400, so that when the crack 000 generated from the edge of the light-emitting layer 200 expands towards the interior of the first inorganic layer 300, the stress relief part 310 is located in front of the organic layer 400 on an expansion path of the crack 000, and thus the expansion of the crack 000 is prevented by the stress relief part 310, without extending to the organic layer 400, thereby playing a role of protecting the organic layer 400, so as to ensure the display performance of the display panel.

In embodiments of the present disclosure, the display panel further includes a driving layer 500 between the substrate 100 and the light-emitting layer 200, and a functional film layer 600 on a side of the organic layer 400 away from the substrate 100.

As shown in FIG. 5, the driving layer 500 includes a buffer layer 510, a polysilicon layer 520, a gate insulation layer 530, a gate metal layer 540, an interlayer dielectric layer 550, a source-drain metal layer 560, a planarization layer 570 and an anode layer 580 sequentially stacked along a direction away from the substrate 100.

In some embodiments of the present disclosure, the gate insulation layer 530 includes a first gate insulation layer GI1 and a second gate insulation layer GI2. The gate metal layer 540 includes a first gate layer G1 and a second gate layer G2. The source-drain metal layer 560 includes a first source-drain layer SD1 and a second source-drain layer SD2. The planarization layer 570 includes a first planarization layer PLN1 and a second planarization layer PLN2.

The substrate 100 may be made of a polyimide material, which has a temperature resistance property, and excellent chemical stability and mechanical properties.

The buffer layer 510 is generally made of an organic material, and is used to prevent the penetration of water vapor, extend a service life of the OLED display panel, and also improve the flatness of the panel surface.

The first gate insulation layer GI1 covers a side of the polysilicon layer 520 away from the substrate 100, and can be made of polyimide to have a high anti-bending strength and anti-tensile strength, so that when the display panel is in a bent state, it can cooperate with the display panel to make corresponding bending and ensure its insulation.

The first gate layer G1 is on a side of the first gate insulation layer GI1 away from the substrate 100, and is used to create or eliminate a channel between a source and a drain, so as to allow or block the flow of electrons.

The second gate insulation layer GI2 covers a side of the first gate layer G1 away from the substrate 100, and can be made of polyimide to have a high anti-bending strength and anti-tensile strength, so that when the display panel is in the bent state, it can cooperate with the display panel to make corresponding bending and ensure its insulation.

The second gate layer G2 is on a side of the second gate insulation layer GI2 away from the substrate 100, and is used to create or eliminate the channel between the source and the drain, so as to allow or block the flow of electrons.

The interlayer dielectric layer 550 is on a side of the second gate layer G2 away from the substrate 100, and is generally made of a low-k material to reduce a time delay and increase a speed. Illustratively, a silicon oxide material may be selected.

The first source-drain layer SD1 is on a side of the interlayer dielectric layer 550 away from the substrate 100, and is used to penetrate a via hole opened in the interlayer dielectric layer 550 and the gate insulation layer 530 and be lapped with an active layer.

The first planarization layer PLN1 is on a side of the first source-drain layer SD1 away from the substrate 100, and is used to meet a flatness requirement of the substrate plane.

The second source-drain layer SD2 is on a side of the first planarization layer PLN1 away from the substrate 100, and is used to penetrate a via hole opened in the first planarization layer PLN1, the interlayer dielectric layer 550 and the gate insulation layer 530 and be lapped with the active layer.

The second planarization layer PLN2 is on a side of the second source-drain layer SD2 away from the substrate 100, and is used to meet the flatness requirement of the substrate plane.

The anode layer 580 is on a side of the second planarization layer PLN2 away from the substrate 100. In embodiments of the present disclosure, the display panel further includes a cathode layer (not shown in the figures), and the cathode layer is on a side of the light-emitting layer 200 away from the substrate 100, and is on the side of the first inorganic layer 300 close to the substrate 100.

As shown in FIG. 6, the functional film layer 600 includes a second inorganic layer 610, a touch layer 620, a pressure-sensitive adhesive layer 630, a polarizer layer 640, an optical adhesive layer 650 and a glass cover plate 660 sequentially stacked in a direction away from the substrate 100.

As shown in FIG. 6, the touch layer 620 includes a plurality of touch sensors, and the plurality of touch sensors include a plurality of touch sensors Tx extending along a first direction and a plurality of touch sensors Rx extending along a second direction, where the first direction is perpendicular to the second direction. As shown in FIG. 6, the touch sensor includes a portion located in a first touch layer M1 and a portion located in a second touch layer M2, and the first touch layer M1 and the second touch layer M2 are located in different layers. An interlayer insulation layer IL is disposed between the first touch layer M1 and the second touch layer M2, and the interlayer insulation layer IL is made of an inorganic insulation material.

To sum up, in the display panel provided by embodiments of the present disclosure, the surface 300*a* of the first inorganic layer 300 away from the light-emitting layer 200 is provided with the stress relief part 310. When the crack 000 occurs at the interface between the first inorganic layer 300 and the light-emitting layer 200, it will pass through the stress relief part 300 during the expansion towards the interior of the first inorganic layer 300, and then the stress relief part 310 can relieve a stress of the first inorganic layer 300, thereby preventing the crack 000 from continuing to expand and preventing it from affecting the performance of other film layers including the organic layer 400. Therefore, the display panel provided by embodiments of the present disclosure improves the performance of the electronic device configured with the OLED display screen in the drop scene, and effectively improves the phenomenon of black spots on the screen.

Figure 7:
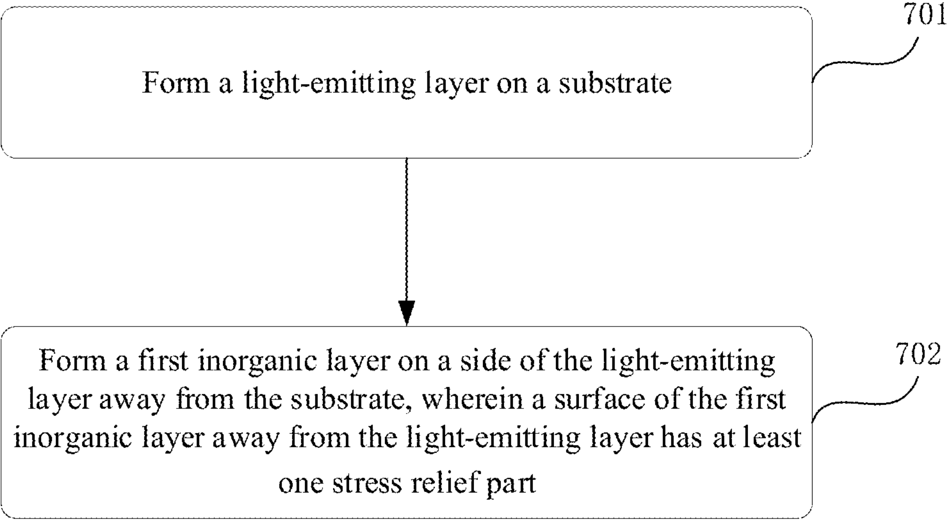
FIG. 7 is a flowchart of a method for manufacturing a display panel provided by an embodiment of the present disclosure.

Embodiments of the present disclosure further provide a method for manufacturing a display panel, which is configured to manufacture the display panel described in any one of the above embodiments. As shown in FIG. 7, the method for manufacturing the display panel includes:

in S710, a light-emitting layer is formed on a substrate; and in S720, a first inorganic layer is formed on a side of the light-emitting layer away from the substrate, and a surface of the first inorganic layer away from the light-emitting layer has a stress relief part.

In the display panel manufactured by the manufacturing method provided by embodiments of the present disclosure, the surface of its first inorganic layer away from the light-emitting layer is provided with the stress relief part. When a crack occurs at an interface between the first inorganic layer and the light-emitting layer, it will pass through the stress relief part during the expansion towards the inside of the first inorganic layer, and then the stress relief part can relieve the stress of the first inorganic layer here, thereby preventing the expansion of the crack, and preventing it from affecting the performance of other film layers including an organic layer. Therefore, the display panel provided by embodiments of the present disclosure improves the performance of the electronic device configured with the OLED display screen in the drop scene, and effectively improves the phenomenon of black spots on the screen.

In some implementations of embodiments of the present disclosure, the stress relief part is a groove, and an opening end of the groove is on the surface of the first inorganic layer away from the light-emitting layer.

A compressive stress layer (that is, an area between the dotted line and a groove wall of the groove in FIG. 3) with a thickness of nanometers can be formed on an outside of the groove wall of each groove. When the crack initiated at an edge of the light-emitting layer that is caused by the collision due to the whole-device drop expands to an outer edge of the groove, the compressive stress layer will absorb the expansion energy of the crack, and at the same time, the groove will relieve the stress concentration at the tip of the crack, so that the stress of the first inorganic layer that forms the crack is released at the groove, thereby avoiding the further expansion of the crack.

In some embodiments of the present disclosure, the groove is a laser ablation groove, and the method for manufacturing the display panel further includes: forming the laser ablation groove, by irradiating the first inorganic layer with a laser, on the surface of the first inorganic layer away from the light-emitting layer, and a diameter of the laser ablation groove is in a range of 10-100 nm.

A whole-device drop test indicates that the laser ablation groove within this diameter range can withstand a certain pressure and has little impact on a display performance of the panel.

In some embodiments of the present disclosure, the laser used to irradiate the first inorganic layer at least meets at least one of:

the laser being a femtosecond laser;

a central wavelength of the laser being 700-900 nm;

an energy density of the laser being 0.03-0.08 J/cm$^2$;

an irradiation time of the laser being 10-60 ps; and the number of bombardments of the laser on the surface of the first inorganic layer away from the light-emitting layer ranging from 20 to 60 times.

In some embodiments of the present disclosure, the central wavelength of the laser may be, for example, 700 nm, 750 nm, 800 nm, 850 nm or 900 nm.

In some embodiments of the present disclosure, the energy density of the laser may be, for example, 0.03, 0.04, 0.05, 0.069, 0.07 or 0.08 J/cm$^2$.

In some embodiments of the present disclosure, the irradiation time of the laser may be, for example, 10, 20, 30, 40, 50 or 60 ps.

In some embodiments of the present disclosure, the number of bombardments of the laser on the surface of the first inorganic layer away from the light-emitting layer may be, for example, 20, 30, 40, 50 or 60 times.

In some embodiments of the present disclosure, an orthographic projection of the groove on the substrate is outside an orthographic projection of a light-emitting device of the light-emitting layer on the substrate.

In some embodiments of the present disclosure, after the first inorganic layer is formed, the first inorganic layer is irradiated with the femtosecond laser, the central wavelength of the laser is 800 nm, the energy density is 0.06 J/cm$^2$, the irradiation time is 10-60 ps, and the number of bombardments is 20-60 times, so as to form the laser ablation groove with the diameter of 10-100 nm on the surface of the first inorganic layer away from the light-emitting layer. A position of the laser irradiation should avoid the light-emitting device of the light-emitting layer, so as to avoid the impact of the laser ablation groove on the light-emitting device to cause the color cast between large viewing angles.

The display panel subject to the laser irradiation is continued to be subject to Thin Film Encapsulation (TFE) packaging and Direct On-cell Touch (DOT) wiring in a conventional manner in the art.

In some embodiments of the present disclosure, the stress relief part further includes a stress absorber, and the method for manufacturing the display panel further includes: forming the stress absorber on a side of the first inorganic layer away from the substrate, and the stress absorber is filled in the groove and is configured to absorb energy released by a stress concentration site on the first inorganic layer.

The stress absorber is filled in the groove and is in connection with an inner wall of the groove. When the crack generated by the edge of the light-emitting layer which is caused by the collision due to the whole-device drop expands to the groove, it will further expand to the stress absorber. However, the stress absorber will absorb the expansion energy of the crack, while relieving the stress concentration at the tip of the crack, so as to prevent the crack from continuing to expand.

The stress absorber can play a role of absorbing the energy through a special structure or material. For example, the stress absorber may have a multi-cavity, porous structure. For another example, the stress absorber may be an elastic member with sufficient elastic margin in the groove. When a stress is transferred to the stress absorber, the stress absorber can deform, so as to consume the energy.

In some embodiments of the present disclosure, the method for manufacturing the display panel further includes: forming an organic layer on the side of the first inorganic layer away from the substrate, and the organic layer covers the surface of the first inorganic layer away from the light-emitting layer, and is in contact with the stress relief part.

In some embodiments of the present disclosure, before the light-emitting layer is formed, the method for manufacturing the display panel further includes: forming a driving layer on the substrate.

Illustratively, before the light-emitting layer is formed, a buffer layer, a polysilicon layer, a gate insulation layer, a gate metal layer, an interlayer dielectric layer, a source-drain metal layer, a planarization layer, and an anode layer are sequentially formed on the substrate.

In some embodiments of the present disclosure, forming the light-emitting layer on the substrate includes: forming the light-emitting layer on a side of the driving layer away from the substrate.

In some embodiments of the present disclosure, after the organic layer is formed, the method for manufacturing the display panel further includes: forming a functional film layer on a side of the organic layer away from the substrate.

Illustratively, after the organic layer is formed, a second inorganic layer, a touch layer, a pressure-sensitive adhesive layer, a polarizer layer, an optical adhesive layer, and a glass cover plate are sequentially formed on a side of the organic layer away from the substrate.

In the display panel manufactured by the manufacturing method provided by embodiments of the present disclosure, the surface of its first inorganic layer away from the light-emitting layer is provided with the stress relief part. When a crack occurs at an interface between the first inorganic layer and the light-emitting layer, it will pass through the stress relief part during the expansion towards the inside of the first inorganic layer, and then the stress relief part can relieve the stress of the first inorganic layer here, thereby preventing the expansion of the crack, and preventing it from affecting the performance of other film layers including an organic layer. Therefore, the display panel provided by embodiments of the present disclosure improves the performance of the electronic device configured with the OLED display screen in the drop scene, and effectively improves the phenomenon of black spots on the screen.

Embodiments of the present disclosure further provide a display device, which may be, for example, an OLED display device, and the display device includes the display panel described in any one of the foregoing embodiments.

Therefore, in the display device provided by embodiments of the present disclosure, the surface of the first inorganic layer of the display panel away from the light-emitting layer is provided with the stress relief part. When a crack occurs at an interface between the first inorganic layer and the light-emitting layer, it will pass through the stress relief part during the expansion towards the inside of the first inorganic layer, and then the stress relief part can relieve the stress of the first inorganic layer here, thereby preventing the expansion of the crack, and preventing it from affecting the performance of other film layers including an organic layer. Therefore, the display panel provided by embodiments of the present disclosure improves the performance of the electronic device configured with the OLED display screen in the drop scene, and effectively improves the phenomenon of black spots on the screen.

EMBODIMENT 1

Electronic devices configured with display panels in the related arts and three types of electronic devices configured with display panels provided by embodiments of the present disclosure are subjected to whole-device drop tests, and the number of electronic devices in each test sample is 5. The stress relief part is a laser-etched groove in the display panel provided by embodiments of the present disclosure. Test pressures are 60 N, 80 N, 100 N and 120 N, respectively, and test results shown in Table 1 below are obtained.

TABLE 1

Whole-device drop test results of four types of electronic devices

| | 60N | 80N | 100N | 120N | Conclusion |
|---|---|---|---|---|---|
| Test sample 1 | 0 | 5 | / | / | Poor |
| Test sample 2 | 0 | 0 | 3 | 2 | Good |
| Test sample 3 | 0 | 0 | 0 | 1 | Best |
| Test sample 4 | 0 | 0 | 0 | 3 | Better |

Test sample 1: electronic devices configured with display panels in the related arts;

test sample 2: electronic devices configured with display panels provided by embodiments of the present disclosure, where an average diameter of laser-etched grooves in the display panel is 23 nm;

test sample 3: electronic devices configured with display panels provided by embodiments of the present disclosure, where an average diameter of laser-etched grooves in the display panel is 62 nm;

test sample 4: electronic devices configured with display panels provided by embodiments of the present disclosure, where an average diameter of laser-etched grooves in the display panel is 87 nm.

Referring to the above Table 1, it can be seen that:

when the test pressure of the whole-device drop test is 60 N, the numbers of electronic devices with black spots on the screen in these four test samples are all 0, that is, test samples 1-4 all pass the test;

when the test pressure of the whole-device drop test is 80 N, the number of electronic devices with black spots on the screen in the test sample 1 is 5, and the numbers of electronic devices with black spots on the screen in the test samples 2-4 are all 0, that is, all electronic devices in the test sample 1 fail the test, and all electronic devices in the test samples 2-4 pass the test;

when the test pressure of the whole-device drop test is 100 N, the number of electronic devices with black spots on the screen in the test sample 2 is 3, and the numbers of electronic devices with black spots on the screen in the test samples 3-4 are both 0, that is, three electronic devices in the test sample 2 fail the test, and all electronic devices in the test samples 3-4 pass the test;

when the test pressure of the whole-device drop test is 120 N, the number of electronic devices with black spots on the screen in the test sample 2 is 2, the number of electronic devices with black spots on the screen in the test sample 3 is 1, and the number of electronic devices with black spots on the screen in the test sample 4 is 3, that is, two electronic devices in the test sample 2 fail the test, one electronic device in the test sample 3 fails the test, and three electronic devices in the test sample 4 fail the test.

From the above analysis, it can be seen that in the whole-device drop test, an anti-pressure ability from high to low is test sample 3, test sample 4, test sample 2 and test sample 1, respectively. Therefore, when the average diameter of the laser-etched grooves is 62 nm, its ability to absorb the expansion energy of the crack is relatively strongest, and thus the anti-pressure and anti-drop effects of the display panel are also relatively optimal.

The present disclosure provides a display panel and a manufacturing method thereof, and a display device. The display panel can improve a phenomenon of black spots on a screen when an electronic device drops, so that the screen of the electronic device has a better performance in a drop scene.

In a first aspect, embodiments of the present disclosure provide a display panel, and the display panel includes:

a substrate;

a light-emitting layer, disposed on a side of the substrate; and a first inorganic layer, by which a surface of the light-emitting layer away from the substrate is covered;

wherein a surface of the first inorganic layer away from the light-emitting layer has a stress relief part.

In some embodiments of the present disclosure, the stress relief part includes a groove, and an opening end of the groove is on the surface of the first inorganic layer away from the light-emitting layer.

In some embodiments of the present disclosure, the groove is a laser ablation groove, and a diameter of the laser ablation groove is in a range of 10-100 nm.

In some embodiments of the present disclosure, the light-emitting layer includes a pixel definition layer and a light-emitting device defined by the pixel definition layer; and an orthographic projection of the groove on the substrate is outside an orthographic projection of the light-emitting device on the substrate.

In some embodiments of the present disclosure, the stress relief part further includes a stress absorber; and the stress absorber is filled in the groove and is configured to absorb energy released by a stress concentration site on the first inorganic layer.

In some embodiments of the present disclosure, the display panel further includes an organic layer, by which the surface of the first inorganic layer away from the light-emitting layer is covered, and the organic layer is in contact with the stress relief part.

In some embodiments of the present disclosure, the display panel further includes a driving layer between the substrate and the light-emitting layer and a functional film layer on a side of the organic layer away from the substrate.

In some embodiments of the present disclosure, the driving layer includes a buffer layer, a polysilicon layer, a gate insulation layer, a gate metal layer, an interlayer dielectric layer, a source-drain metal layer, a planarization layer, and an anode layer sequentially stacked along a direction away from the substrate;

and/or, the functional film layer includes a second inorganic layer, a touch layer, a pressure-sensitive adhesive layer, a polarizer layer, an optical adhesive layer, and a glass cover plate sequentially stacked along the direction away from the substrate.

In a second aspect, embodiments of the present disclosure provide a method for manufacturing a display panel, and the method includes:

forming a light-emitting layer on a substrate; and forming a first inorganic layer on a side of the light-emitting layer away from the substrate;

wherein a surface of the first inorganic layer away from the light-emitting layer has a stress relief part.

In some embodiments of the present disclosure, the stress relief part includes a groove, and an opening end of the groove is on the surface of the first inorganic layer away from the light-emitting layer.

In some embodiments of the present disclosure, the groove is a laser ablation groove, and the method further includes:

forming the laser ablation groove, by irradiating the first inorganic layer with a laser, on the surface of the first inorganic layer away from the light-emitting layer, wherein a diameter of the laser ablation groove is in a range of 10-100 nm.

In some embodiments of the present disclosure, the laser is a femtosecond laser; and/or, a central wavelength of the laser is 700-900 nm; and/or, an energy density of the laser is 0.03-0.08 J/cm$^2$; and/or, an irradiation time of the laser is 10-60 ps; and/or, a number of bombardments of the laser on the surface of the first inorganic layer away from the light-emitting layer is in a range of 20-60 times.

In some embodiments of the present disclosure, an orthographic projection of the groove on the substrate is outside an orthographic projection of the light-emitting layer on the substrate.

In some embodiments of the present disclosure, the stress relief part further includes a stress absorber, and the method further includes:

forming the stress absorber on a side of the first inorganic layer away from the substrate, wherein the stress absorber is filled in the groove and is configured to absorb energy released by a stress concentration site on the first inorganic layer.

In some embodiments of the present disclosure, the method further includes:

forming an organic layer on the side of the first inorganic layer away from the substrate, wherein the surface of the first inorganic layer away from the light-emitting layer is covered by the organic layer, and the organic layer is in contact with the stress relief part.

In some embodiments of the present disclosure, before forming the light-emitting layer, the method further includes:

forming a driving layer on the substrate;

forming the light-emitting layer on the substrate includes:

forming the light-emitting layer on a side of the driving layer away from the substrate;

after forming the organic layer, the method further includes:

forming a functional film layer on a side of the organic layer away from the substrate.

In some embodiments of the present disclosure, forming the driving layer on the side of the substrate includes:

forming a buffer layer, a polysilicon layer, a gate insulation layer, a gate metal layer, an interlayer dielectric layer, a source-drain metal layer, a planarization layer and an anode layer sequentially on the substrate;

and/or, the forming the functional film layer on the side of the organic layer away from the substrate includes:

forming a second inorganic layer, a touch layer, a pressure-sensitive adhesive layer, a polarizer layer, an optical adhesive layer, and a glass cover plate sequentially on the side of the organic layer away from the substrate.

In a third aspect, embodiments of the present disclosure provide a display device, and the display device includes the display panel described in the first aspect.

In the display panel provided by embodiments of the present disclosure, the surface of the first inorganic layer away from the light-emitting layer is provided with the stress relief part. When a crack occurs at an interface between the first inorganic layer and the light-emitting layer, it will pass through the stress relief part during the expansion towards the interior of the first inorganic layer, and then the stress relief part can relieve the stress of the first inorganic layer, thereby preventing the crack from continuing to expand and preventing it from affecting the performance of other film layers including the organic layer. Therefore, the display panel provided by embodiments of the present disclosure improves the performance of the electronic device configured with the OLED display screen in the drop scene, and effectively improves the phenomenon of black spots on the screen.

In the present disclosure, it should be understood that the terms “first”, “second”, “third” or the like are used for descriptive purposes only, and should not be taken to indicate or imply relative importance, or implicitly indicate the number of indicated technical features.

The above description is only for those skilled in the art to understand the technical solutions of the present disclosure, and is not intended to limit the present disclosure. Any modifications, equivalent replacements, improvements, etc. made within the spirit and principles of the present disclosure shall be included in the protection scope of the present disclosure.

What is claimed is:

1. A display panel, comprising:

a substrate;

a light-emitting layer, disposed on a side of the substrate; and a first inorganic layer covering a surface of the light-emitting layer and the surface of the light-emitting layer is away from the substrate, wherein a surface of the first inorganic layer away from the light-emitting layer comprises a stress relief part, wherein the stress relief part comprises a laser ablation groove, and a diameter of the laser ablation groove is in a range of 10-100 nm.

2. The display panel according to claim 1, wherein an opening end of the laser ablation groove is on the surface of the first inorganic layer away from the light-emitting layer.

3. The display panel according to claim 1, wherein the light-emitting layer comprises a pixel definition layer and a light-emitting device defined by the pixel definition layer; and an orthographic projection of the laser ablation groove on the substrate is outside an orthographic projection of the light-emitting device on the substrate.

4. The display panel according to claim 1, wherein the stress relief part further comprises a stress absorber; and the stress absorber is filled in the laser ablation groove and is configured to absorb energy released by a stress concentration site on the first inorganic layer.

5. The display panel according to claim 1, wherein the display panel further comprises an organic layer, and the surface of the first inorganic layer away from the light-emitting layer is covered by the organic layer, and the organic layer is in contact with the stress relief part.

6. The display panel according to claim 5, wherein the display panel further comprises a driving layer between the substrate and the light-emitting layer and a functional film layer on a side of the organic layer away from the substrate.

7. The display panel according to claim 6, wherein:

the driving layer comprises a buffer layer, a polysilicon layer, a gate insulation layer, a gate metal layer, an interlayer dielectric layer, a source-drain metal layer, a planarization layer and an anode layer sequentially stacked along a direction away from the substrate; or the functional film layer comprises a second inorganic layer, a touch layer, a pressure-sensitive adhesive layer, a polarizer layer, an optical adhesive layer and a glass cover plate sequentially stacked along the direction away from the substrate.

8. A method for manufacturing a display panel, comprising:

forming a light-emitting layer on a substrate; and forming a first inorganic layer on a side of the light-emitting layer away from the substrate, wherein a surface of the first inorganic layer away from the light-emitting layer comprises a stress relief part, wherein the stress relief part comprises a laser ablation groove, and the method further comprises:

forming the laser ablation groove, by irradiating the first inorganic layer with a laser, on the surface of the first inorganic layer away from the light-emitting layer, wherein a diameter of the laser ablation groove is in a range of 10-100 nm.

9. The method according to claim 8, wherein an opening end of the laser ablation groove is on the surface of the first inorganic layer away from the light-emitting layer.

10. The method according to claim 8, wherein, the laser is femtosecond laser, and the laser comprises at least one of following manners:

a central wavelength of the laser is 700-900 nm;

an energy density of the laser is 0.03-0.08 J/cm$^2$;

an irradiation time of the laser is 10-60 ps; or a number of bombardments of the laser on the surface of the first inorganic layer away from the light-emitting layer is in a range of 20-60 times.

11. The method according to claim 8, wherein an orthographic projection of the laser ablation groove on the substrate is outside an orthographic projection of a light-emitting device of the light-emitting layer on the substrate.

12. The method according to claim 8, wherein the stress relief part further comprises a stress absorber, and the method further comprises:

forming the stress absorber on a side of the first inorganic layer away from the substrate, wherein the stress absorber is filled in the laser ablation groove and is configured to absorb energy released by a stress concentration site on the first inorganic layer.

13. The method according to claim 8, further comprising:

forming an organic layer on a side of the first inorganic layer away from the substrate, wherein the surface of the first inorganic layer away from the light-emitting layer is covered by the organic layer, and the organic layer is in contact with the stress relief part.

14. The method according to claim 13, wherein before forming the light-emitting layer, the method further comprises:

forming a driving layer on the substrate;

wherein forming the light-emitting layer on the substrate comprises:

forming the light-emitting layer on a side of the driving layer away from the substrate; and wherein after forming the organic layer, the method further comprises:

forming a functional film layer on a side of the organic layer away from the substrate.

15. The method according to claim 14, wherein forming the driving layer on the side of the substrate comprises at least one of followings:

forming a buffer layer, a polysilicon layer, a gate insulation layer, a gate metal layer, an interlayer dielectric layer, a source-drain metal layer, a planarization layer and an anode layer sequentially on the substrate; or the forming the functional film layer on the side of the organic layer away from the substrate comprises:

forming a second inorganic layer, a touch layer, a pressure-sensitive adhesive layer, a polarizer layer, an optical adhesive layer and a glass cover plate sequentially on the side of the organic layer away from the substrate.

16. A display device, comprising a display panel, wherein the display panel comprises:

a substrate;

a light-emitting layer, disposed on a side of the substrate; and a first inorganic layer covering a surface of the light-emitting layer away from the substrate, wherein a surface of the first inorganic layer away from the light-emitting layer comprises a stress relief part, wherein the stress relief part comprises a laser ablation groove, and a diameter of the laser ablation groove is in a range of 10-100 nm.

17. The display device according to claim 16, wherein an opening end of the laser ablation groove is on the surface of the first inorganic layer away from the light-emitting layer.

* * * * *